(12) United States Patent
Keusseyan (10) Patent No.: US 7,052,824 B2
(45) Date of Patent: May 30, 2006

(54) PROCESS FOR THICK FILM CIRCUIT PATTERNING

(75) Inventor: Roupen Leon Keusseyan, Raleigh, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 267 days.

(21) Appl. No.: 10/275,183

(22) PCT Filed: Jun. 26, 2001

(86) PCT No.: PCT/US01/20252

§ 371 (c)(1),
(2), (4) Date: Nov. 1, 2002

(87) PCT Pub. No.: WO02/03766

PCT Pub. Date: Jan. 10, 2002

(65) Prior Publication Data

US 2003/0211406 A1     Nov. 13, 2003

Related U.S. Application Data

(60) Provisional application No. 60/215,363, filed on Jun. 30, 2000.

(51) Int. Cl.
*G03F 7/00*   (2006.01)
(52) U.S. Cl. ...................... 430/313; 174/250
(58) Field of Classification Search ................ 430/198, 430/313; 174/250; 361/397, 719; 427/430.1, 427/155, 434.2, 294
See application file for complete search history.

(56) References Cited

U.S. PATENT DOCUMENTS

| 3,060,025 | A | 10/1962 | Abraham |
|---|---|---|---|
| 3,620,726 | A | 11/1971 | Chu |
| 3,649,268 | A | 3/1972 | Chu |
| 3,901,710 | A | 8/1975 | Ranz |
| 4,174,216 | A | 11/1979 | Cohen |
| 4,247,619 | A | 1/1981 | Cohen |
| 4,275,140 | A | 6/1981 | Neiss |
| 4,282,308 | A | 8/1981 | Cohen |
| 4,304,839 | A | 12/1981 | Cohen |

(Continued)

FOREIGN PATENT DOCUMENTS

GB     0640879     11/1996

(Continued)

OTHER PUBLICATIONS

Patent Abstracts of Japan, vol. 1998, No. 05, Apr. 30, 1998 & JP 10 016118 A (Toppan Printing Co. Ltd), Jan. 20, 1998 abstract.
D. Dudek and T. Pfeiffer, PCS—Photoformed Conductors on Ceramic Substrates, SUSS Report, Mar., 1990, pp. 8-11.

*Primary Examiner*—Kathleen Duda (57) ABSTRACT

A process for patterning thick film electrically functional patterns using a photosensitive polymer layer. A tacky photosensitive layer is applied onto a substrate surface. The photosensitive layer is imaged with a pattern using actinic radiation, the exposed areas of the photosensitive layer become hardened and non-tacky. A subsequent application of a thick film composition sheet will cause the thick film to adhere to the remaining tacky areas. Upon peeling the sheet, a thick film print pattern will be produced. This step is followed by a processing profile prescribed by the thick film composition used which results in a pattern having electrically functional properties. The invention also extends to a process wherein a thick film composition is recovered from a used sheet.

4 Claims, 5 Drawing Sheets

U.S. PATENT DOCUMENTS

| | | | |
|---|---|---|---|
| 4,567,062 A * | 1/1986 | Fan | 430/312 |
| 4,604,340 A | 8/1986 | Grossa | |
| 4,668,604 A | 5/1987 | Cohen et al. | |
| 5,011,754 A | 4/1991 | Ono | |
| 5,024,922 A * | 6/1991 | Moss et al. | 430/330 |
| 5,110,384 A | 5/1992 | Dudek | |
| 5,126,226 A | 6/1992 | Fröhlich et al. | |
| 5,167,989 A | 12/1992 | Dudek | |
| 5,296,259 A | 3/1994 | Dudek | |
| 5,870,224 A | 2/1999 | Saitoh | |
| 6,569,252 B1 * | 5/2003 | Sachdev et al. | 134/36 |

FOREIGN PATENT DOCUMENTS

| | | |
|---|---|---|
| IT | RM94 A 000329 | 5/1994 |
| JP | 301339 A | 10/1992 |
| JP | 1149990 A | 2/1999 |

* cited by examiner

PROCESS FOR THICK FILM CIRCUIT PATTERNING

CROSS-REFERENCE TO RELATED DOCUMENT

The present application claims the benefit of Provisional Application 60/215,363, which was filed on Jun. 30, 2000.

FIELD OF THE INVENTION

The invention relates to forming an electrically functional pattern on a substrate. More specifically, the invention relates to a process for using a photosensitive element in combination with a sheet having a thick film composition applied to a support. The invention also relates to a process for recovering the thick film composition from a used sheet.

BACKGROUND OF INVENTION

Established patterning methods used in the thick film industry include printing (screen or other), spraying, brushing, spin coating, dipping, laminating, photo-patterning and etching. Screen-printing is by far the most commonly used method for patterning thick film circuits. A certain amount of a thick film composition is placed at the edge of a printing screen wherein a squeegee moves and presses the thick film composition across the screen. A circuit pattern similar to the screen openings is printed on the substrate. The printed substrate is then dried which causes most of the solvent in the thick film composition to evaporate, and then fired which causes burnout of any organic vehicle. Although screen print pattern resolution can be improved by optimizing screen wire-mesh dimensions, emulsion type, thickness, and screen printing variables; there is an accepted opinion in the industry that screen printed fine line and space resolution is not adequate for certain applications, since screen printed line resolutions are about 125 microns or larger.

Photo-patterning and etching approaches are alternative patterning technologies that offer uniform finer lines and space resolution when compared to screen-printing. A photo-patterning method, such as DuPont's FODEL® printing system, utilizes a photosensitive organic medium as found in patents U.S. Pat. Nos. 4,912,019; 4,925,771; 5,032,490, whereby the substrate is first completely covered (printed, sprayed, coated or laminated) with the photosensitive thick film composition and dried. An image of the circuit pattern is exposed by actinic radiation through a photomask bearing a circuit pattern, the exposed substrate is then developed. The unexposed portion of the circuit pattern is washed away leaving a patterned substrate that is fired to remove all remaining organic materials and sinter inorganic materials. Such a photo-patterning method demonstrates thick film line resolution of about 30 microns or larger depending on the substrate smoothness, inorganic particle size distribution, exposure and development variables. The narrow window of particle size distribution, circuit line conductivity, thickness and circuit line thickness uniformity are limitations of this thick film photo-patterning method.

Another system of patterning is an etching method, a thick film composition is printed, dried and fired on a substrate surface. A photoresist is then applied on top of the fired thick film surface that is sequentially exposed and developed. The substrate is then dipped or sprayed with a chemical that etches the fired metallization in the open areas of the photoresist. After washing and resist removal, a desired circuit pattern is produced on the substrate. Line capabilities of etch patterning is about 10 microns or larger depending on the substrate smoothness, particle size distribution of the inorganic powders, type and activity of the etching solution and photoresist adhesion. The use of hazardous chemical etching solutions and remnant inorganic binder found on top of the substrate surface are some limitations of the thick film etch patterning approach for display and other applications.

Yet, another system is described in U.S. Pat. Nos. 5,110,384, 5,167,989 and 5,296,259. These patents describe a dry powder method of applying conductive or phosphor particles in a pattern to a substrate. Precleaned ceramic substrates are coated with a thin layer of a phototackifiable material, exposed imagewise with UV light, toned with metal powder toner material and fired according to conventional thick film firing profiles.

The graphic arts industry widely uses photosensitive elements to create color patterns of an image. The elements usually comprise a support, a photosensitive layer and a cover sheet. The photosensitive layer of the element either looses tackiness or becomes tacky upon exposure to actinic radiation. The exposure of the photosensitive layer is used to create a latent image which is then formed by applying toner particles by way of a powder or a toner sheet to the imagewise exposed element. The toner particles stick to the tacky areas so that an image is created by the toner particles adhered to the tacky areas. U.S. Pat. No. 3,649,268 describes a reproduction process using positive-working photosensitive elements. Negative-working photosensitive elements are also known which require a dual exposure to provide a negative image with tacky and non-tacky areas. Negative-working elements and their process of use are disclosed in U.S. Pat. Nos. 4,174,216 and 4,247,619.

The present invention combines the concept of forming an imaged pattern on a substrate using a photosensitive element used in the graphics art industry and a thick film composition used in established methods of pattern formation in the electronics industry. The invention does not include the step of developing a photosensitive element that is needed to form color images in the graphics art industry. It has been found that the invention produces high quality circuit patterns with substantially no shrinkage, edge curl or undercut at a low cost in an environmentally compatible manner.

SUMMARY OF THE INVENTION

The present invention is directed to a process for forming a pattern having electrically functional properties on a substrate comprising the steps of: (a) providing a photosensitive layer having a tacky surface disposed on a substrate; (b) image-wise exposing the photosensitive tacky surface to form an imaged layer having tacky and non-tacky areas; (c) applying a sheet comprising at least one layer of a thick film composition disposed on a support to the imaged layer wherein the imaged layer is in contact with the thick film composition of the sheet; (d) removing the support wherein the thick film composition remains on the support in the non-tacky areas of the imaged layer and the thick film composition substantially adheres to the tacky areas of the imaged layer forming a patterned article; and (e) firing the thick film composition of the patterned article.

The above process also may be practiced without exposure of a tacky surface resulting in full coverage of the tacky surface by the thick film composition.

The present invention is further directed to a process for forming a pattern having electrically functional properties on a substrate comprising the steps of: (a) providing a photosensitive layer having a tacky surface disposed on a substrate; (b) image-wise exposing the photosensitive tacky surface to form an imaged layer having tacky and non-tacky areas; (c) applying the exposed photosensitive layer to a sheet comprising at least one layer of a thick film composition disposed on a support wherein the imaged layer is in contact with the thick film composition of the sheet; (d) removing the imaged layer wherein the thick film composition substantially adheres to the tacky areas of the imaged layer and remains on the support in the non-tacky areas of the imaged layer forming a patterned article; (e) curing the thick film composition of the patterned article.

The present invention is still further directed to a process for the recovery of a thick film composition from a support comprising a support having a dried thick film composition in the form of a reverse circuit pattern comprising the sequential steps of: (a) passing the dried thick film composition on a first support through a solvent bath to form a solution of the thick film composition; (b) adjusting the viscosity of the solution to form a castable solution; and (c) applying the castable solution on a second support.

The present invention is still further directed to a method for using a photosensitive layer to form a pattern having electrically functional properties with a thick film composition, comprising the steps of: (a) forming tacky and non-tacky areas on the surface of a photosensitive layer by image-wise exposing the photosensitive layer to actinic radiation to form an image-wise exposed surface; (b) contacting the image-wise exposed surface with a thick film composition which substantially adheres to the tacky areas but does not adhere to the nontacky areas to form a pattern of thick film composition on the image-wise exposed surface; and (c) firing the thick film composition on the image-wise exposed surface.

DETAILED DESCRIPTION OF THE INVENTION

Generally, a thick film composition comprises a functional phase that imparts appropriate electrically functional properties, such as, conductive, resistive and dielectric properties. The functional phase comprises electrically functional powders dispersed in an organic medium that acts as a carrier for the functional phase. The functional phase determines the electrical properties and influences mechanical properties of a dried thick film. There are two main types of thick film compositions that may be utilized in this invention. Both are conventional products sold in the electronics industry. First, thick film compositions wherein the organics of the compositions during processing is burned or fired out are referred to as "firable thick film compositions". They typically comprise conductive, resistive or dielectric powders and inorganic binder dispersed in organic medium. Prior to firing, a processing requirement may include an optional heat treatment such as: drying, curing, reflow, soldering and others known to those skilled in the art of thick film technology. Second, thick film compositions that typically comprise conductive, resistive or dielectric powders and are dispersed in organic medium wherein the compositions during processing are cured and the organics remains are referred to as "polymer thick film compositions". Fireable thick film compositions and polymer thick film compositions are generally referred to as "thick film compositions". "Organics" comprise polymer or resin components of a thick film composition.

In conductor applications the functional phase is comprised of electrically functional conductor powder(s). The electrically functional powders in a given thick film composition may comprise a single type of powder, mixtures of powders, alloys or compounds of several elements. Examples of such powders include: gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions.

In resistor compositions, the functional phase is generally a conductive oxide. Examples of the functional phase in resistor compositions are Pd/Ag and $RuO_2$. Other examples include ruthenium pyrochlore oxide which is a multi-component compound of $RU^{+4}$, $IR^{+4}$ or a mixture of these (M"), said compound being expressed by the following general formula:

$$(M_xBi_{2-x})(M'_yM''_{2-y})O_{7-z}$$

wherein

M is selected from the group consisting of yttrium, thallium, indium, cadmium, lead, copper and rare earth metals, M' is selected from the group consisting of platinum, titanium, chromium, rhodium and antimony, M" is ruthenium, iridium or a mixture thereof, x denotes 0 to 2 with a proviso that $x \leq 1$ for monovalent copper, y denotes 0 to 0.5 with the proviso that when M' is rhodium or two or more of platinum, titanium, chromium, rhodium and antimony, y stands for 0 to 1, and z denotes 0 to 1 with a proviso that when M is divalent lead or cadmium, z is at least equal to about x/2.

These ruthenium pyrochlore oxides are described in detail in the specification of U.S. Pat. No. 3,583,931. The preferred ruthenium pyrochlore oxides are bismuth ruthenate $(Bi_2Ru_2O_7)$ and lead ruthenate $(Pb_2Ru_2O_6)$.

In dielectric compositions, the functional phase is generally a glass or ceramic. Dielectric thick film compositions are nonconducting compositions or insulator compositions that separate electrical charges and may result in the storage of an electrical charge. Therefore, the thick film dielectric compositions typically contain ceramic powders, oxide and non-oxide frits, crystallization initiator or inhibitor, surfactants, colorants, organic mediums, and other components common in the art of such thick film dielectric compositions. Examples of ceramic solids include: alumina, titanates, zirconates and stannates, $BaTiO_3$, $CaTiO_3$, $SrTiO_3$, $PbTiO_3$, $CaZrO_3$, $BaZrO_3$, $CaSnO_3$, $BaSnO_3$ and $Al2O_3$, glass and glass-ceramic. It is also applicable to precursors of such materials, i.e., solid materials which upon firing are converted to dielectric solids, and to mixtures thereof.

The powders described hereinabove are finely dispersed in an organic medium and are optionally accompanied by, inorganic binders, metal oxides, ceramics, and fillers, such as other powders or solids. The function of an inorganic binder in a thick film composition is binding the particles to one another and to the substrate after firing. Examples of inorganic binders include glass binders (frits), metal oxides and ceramics. Glass binders useful in the thick film composition are conventional in the art. Some examples include borosilicates and aluminosilicates glasses. Examples further include combinations of oxides, such as: $B_2O_3$, $SiO_2$, $Al_2O_3$, CdO, CaO, BaO, ZnO, $SiO_2$, $Na_2O$, PbO, and ZrO which may be used independently or in combination to form glass binders. Typical metal oxides useful in thick film compositions are conventional in the art and can be, for example, ZnO, MgO, CoO, NiO, FeO, MnO and mixtures thereof.

The functional phase and any other powders are typically mixed with an organic medium by mechanical mixing to form a pastelike composition having suitable consistency and rheology for printing. A wide variety of inert liquids can be used as organic medium. The organic medium must be one in which the solids are dispersible with an adequate degree of stability. The rheological properties of the medium must be such that they lend good application properties to the composition. Such properties include: dispersion of solids with an adequate degree of stability, good application of composition, appropriate viscosity, thixotropic, appropriate wettability of the substrate and the solids, a good drying rate, good firing properties, and a dried film strength sufficient to withstand rough handling. The organic medium is conventional in the art and is typically a solution of the polymer in solvent(s). The most frequently used resin for this purpose is ethyl cellulose. Other examples of resins include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. Various combinations of these and other solvents are formulated to obtain the viscosity and volatility requirements desired.

In addition, the thick film composition can also include other metal particles and inorganic binder particles to enhance various properties of the composition, such as adhesion, sintering, processing, brazeability, solderability, reliability, etc. during processing. Oxalic acid catalyzed alkyl t-butyl/amyl phenolic resin is an example of an adhesion promoter used to increase adhesion of the thick film composition to a support of a transfer sheet which is further described hereinbelow.

In a fireable thick film composition, when firing in the 300 to 1000° C. temperature range, adhesion of the thick film composition to the substrate is generally achieved by the melted glass frit(s) wetting the substrate. The inorganic binder (glass frits, metal oxides and other ceramics) portion of the thick film composition is the focus of adhesion to the substrate. For example, in a traditional thick film conductor composition firing, the sintered metal powders are wetted or interlocked by the inorganic binder, at the same time, the inorganic binder wets or interlocks with the substrate, thus, producing adhesion between the sintered metal powders and the substrate. Hence, for thick film functionality, it is important that the patterning technology deposits a well dispersed thick film composition with all the necessary ingredients within prescribed quantities. For firing temperatures above 1000° C., in addition to inorganic binder wetting/interlocking adhesion mechanisms, other interactions and compound formation could contribute to adhesion mechanisms.

Polymeric thick film compositions are mainly made up of conductive, resistive or dielectric powders, such as those discussed hereinabove, dispersed in an organic medium containing polymer or natural and synthetic resin and solvent, typically volatile solvent and a polymer. They typically do not include glass frit since they are cured and not fired. Some examples of typical polymers employed in polymeric thick film compositions are polyesters, acrylics, vinyl chlorides, vinyl acetates, urethanes, polyurethanes, epoxies, phenolic resin systems, or mixtures thereof. The organic medium is preferably formulated to give appropriate wettability of the particles and the substrate, good drying rate, dried film strength sufficient to withstand rough handling. Satisfactory appearance of the dried composition is also important.

Solvents suitable must dissolve the polymer. Some examples of solvents are listed: propylene glycol monomethyl ether acetate, methyl propanol acetate, 1-methoxy-2 propanol acetate, methyl cellosolve acetate, butyl propionate, primary amyl acetate, hexyl acetate, cellosolve acetate, pentyl propionate, diethylene oxalate, dimethyl succinate, dimethyl glutarate, dimethyl adipate, methyl isoamyl ketone, methyl n-amyl ketone, cyclohexanone, diacetone alcohol, diisobutyl ketone, n-methyl pyrolidone, butyrolactone, isophorone, methyl n-isopropyl ketone. Various combinations of these and other solvents are formulated to obtain the desired viscosity and volatility requirements for the process that the polymer thick film composition is to be employed.

The organic medium is required to impart the necessary adhesion to the desired substrate, and it, also, provides the composition with the required surface hardness, resistance to environment changes and flexibility. Additives as known to those skilled in the art may be employed in the organic medium to fine-tune the viscosity for printing.

After applying a polymer thick film composition on a base material, the composition is typically dried by heating at temperatures of up to about 150° C. which cause the volatile solvents to be driven off or dried. After drying, depending on the application, the composition will undergo a curing process wherein the polymer will bind the powder to form a circuit pattern or other desired result. In order to obtain the desired end properties, one skilled in the art knows it is important that the thick film composition contains an optimized amount of each of the desired ingredients to meet the end result. For example, a thick film silver composition for varistor termination applications, may contain 70+ or –2 percent of a specific silver powder, 2+ or –0.04 percent of a mixture of frits that are compatible with the type of varistor ceramic substrate used, 0.5+ or –0.01 percent of metal oxide adhesion promoter, sintering promoter/inhibitor and the balance being organic medium consisting of polymer(s), solvent(s), surfactant(s), dispersant(s) and other materials commonly used in the art of thick film compositions. The optimized amount of each ingredient is important to achieve the desired thick film conductor, resistor, dielectric or emitter properties. The properties needed may include coverage, density, uniform thickness and circuit pattern dimensions, electrical properties such as: resistivity, current-voltage-temperature characteristics, microwave, radio-high frequency characteristics, capacitance, inductance, etc.; interconnection characteristic properties, such as: solder or braze wetting, compression and wire bonding, adhesive joining, and junction characteristics; optical properties, such as: fluorescence; and other initial and aged/stress testing properties that may be required.

PROCESS DESCRIPTION AND MATERIAL SYSTEMS

The process of the present invention comprises a photosensitive polymer layer that is applied onto a substrate surface. In a patterning process, a pattern is imaged onto a tacky photosensitive polymer layer using actinic radiation; the exposed areas of the polymer layer undergo a chemical change that renders the areas non-tacky. A subsequent application of a thick film transfer sheet, preferably by lamination, will cause a thick film composition which has electrically functional properties to adhere only at the tacky patterned areas. Upon peeling off the transfer sheet, a thick film print of the pattern will be produced on top of the tacky areas of the imaged photosensitive layer. Typical processing conditions as prescribed by the thick film composition used on the transfer sheet will then be followed.

Figure 1A:
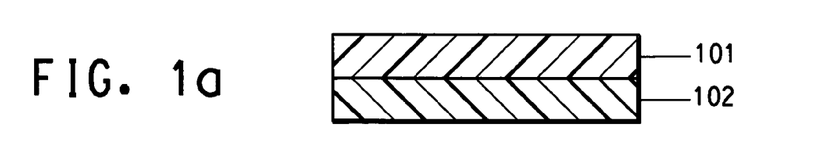
FIG. 1 is an illustrative diagram depicting an embodiment of the process of the present invention.

The new thick film patterning approach comprises the following materials and process steps:

A sheet, referred to as a transfer sheet for illustration purposes, is depicted by FIG. 1(a). It comprises at least one layer of a dried-strippable thick film composition (101), preferably a fireable thick film composition, with powders, inorganic binders and organic mediums as found in the thick film compositions as described hereinabove, deposited on a support (102).

The thick film composition is deposited, for example, by casting, printing or spraying on a strippable support and then dried. During drying the volatile organic solvents are evaporated. The support is a delivery vehicle for applying the dried thick film composition to an imaged photosensitive layer. The dried-strippable thick film composition layer should have sufficient adhesion to the support to remain affixed to the support throughout the required process steps, but at the same time, the adhesive strength of the dried-strippable layer should be carefully balanced with the adhesive strength of the strippable support so the thick film composition could be deposited on an imaged photosensitive layer to carryout the steps in the process of the invention.

The strippable support may comprise almost any material that has reasonable flexibility and integrity. A single layer or multiple layers of a thick film composition may be applied to the support. The support is generally smooth and flat and dimensionally stable. A polyester or polyolefin film e.g. polyethylene polypropylene are examples of suitable supports. Examples of suitable materials that can be used as a support include MYLAR® polyester (polyethylene terepthalate) film available from E. I. du Pont de Nemours and Company and TRESPAPHAN® film available from Hoechst, Winston-Salem, N.C. The support typically has a thickness of 10 to 250 microns. The support may be in sheet form, which may be proportional to the size of the pattern that needs to be created or the support may be in a continuous roll. The roll will allow for continuous mass production. Optionally, a flexible cover sheet may be present on the outmost layer of the dried thick film composition layer. The cover sheet protects the underlaying areas and is easily removable.

In another embodiment of a transfer sheet, multiple layers of thick film compositions may be deposited on a support resulting in a dual-layer transfer sheet. A first layer of the multiple layers may include a silver-containing thick film composition layer cast and dried onto a support. A second layer may include a black thick film composition contrast layer cast and dried on top of the silver thick film layer resulting in two layers of thick film composition on one support.

In another embodiment of a transfer sheet, the components of the thick film composition could be separated. For example, a precious metal with organic medium could be cast onto one support, and inorganic powders with organic medium could be cast onto another support. The process of the invention would then be accomplished in two steps.

The process employs a photosensitive layer having a tacky surface. The photosensitive layer comprises an optional strippable support or base layer, a photosensitive tacky layer and a strippable cover sheet, wherein the strippable support has greater adhesion to the photosensitive tacky layer than the strippable cover sheet. Actinic radiation impinges on the photosensitive layer containing at least one photoactive component to induce a physical or chemical change in that material. In the photosensitive compositions which are useful in the present invention, exposure to actinic radiation causes a change in the tackiness of the layer. This element would be a positive working element as known in the art of photolithography. Examples would be CROMALIN® photosensitive products sold by E. I. du Pont de Nemours and Company, Wilmington, Del. Descriptions of positive working photosensitive elements are disclosed in U.S. Pat. Nos. 3,649,268; 4,734,356 (positive working photosensitive elements including a support layer, a photosensitive layer having a binder component, an ethylenically unsaturated monomer component and a photopolymerizable initiator, and optionally a cover sheet); U.S. Pat. No. 4,849,322 (a multilayer element comprising a cover sheet, photoadherent layer and tonable contiguous layer); U.S. Pat. Nos. 4,892,802; 4,948,704; 4,604,340 and 4,698,293.

In the case where the photosensitive compositions become less tacky to non-tacky (hereinafter referred to as "non-tacky") when image-wise exposed to actinic radiation, the composition is referred to as "photohardenable". Photohardenable systems are well known and preferred in the present invention and generally include a photoinitiator or photoinitiator system (hereinafter referred to collectively as "photoinitiator system"), and at least one compound which reacts with the species generated by exposure of the photoinitiator to actinic radiation, causing a decrease in tackiness, an ethylenically unsaturated compound, and a binder. In this context, the photoinitiator system, when exposed to actinic radiation, acts as a source of free radicals needed to initiate polymerization and/or crosslinking of the ethylenically unsaturated compound. Although not limited to photohardenable systems, the photosensitive layer of the element of the invention will be further described in terms of such systems.

The photoinitiator system has one or more compounds that directly furnish free radicals when activated by actinic radiation. The system also may contain a sensitizer that is activated by the actinic radiation, causing the compound to furnish the free radicals. Useful photoinitiator systems can also contain a sensitizer that extends spectral response into the near ultraviolet, visible, and near infrared spectral regions.

Photoinitiator systems are well known and discussions of such systems can be found in, for example, "Photoreactive Polymers: The Science and Technology of Resists" by A. Reiser, John Wiley & Sons, New York, 1989, and "Radiation Curing: Science and Technology" edited by S. P. Pappas, Plenum Press, New York, 1992.

Preferred photoinitiator systems are free radical generating addition polymerization initiators activatable by actinic light and thermally inactive at and below 100° C. These include the substituted or unsubstituted polynuclear quinones such as 9,10-anthroquinone; vicinal ketaldonyl alcohols, such as benzoin; α-hydrocarbon-substituted aromatic acyloins, including α-methylbenzoin; Michler's ketone, benzophenone, hexaarylbiimidazoles in association with hydrogen donors. Particularly preferred photoinitiators include hexaarylbiimidazoles with hydrogen donors; Michler's ketone and ethyl Michler's ketone, particularly in association with benzophenone; and acetophenone derivatives.

The ethylenically-unsaturated compound is one which is capable of undergoing free-radical initiated polymerization and/or crosslinking. Such compounds are generally known as monomers or oligomers, although polymers having reactive pendant groups can also be used. Such compounds are well known in the art and have been disclosed in, for example, "Light-Sensitive Systems: Chemistry and Application of Nonsilver Halide Photographic Processes" by J. Kosar (John Wiley & Sons, Inc., 1965); "Imaging Processes and Materials—Neblette's Eighth Edition" edited by J. Sturge, V. Walworth and A. Shepp (Van Nostrand Reinhold, 1989); and "Photoreactive Polymer—The Science and Technology of Resists" by A. Reiser (John Wiley & Sons, 1989). Typical monomers are: unsaturated esters of alcohols, preferably esters of polyols with acrylic or methacrylic acid, such as t-butyl acrylate, cyclohexyl acrylate, hydroxy-C1–C10-alkyl acrylate, butanediol diacrylate, hexamethylene glycol diacrylate, trimethylolpropane triacrylate, polyoxyethylated trimethylopropane triacrylate, diethylene glycol diacrylate, glycerol triacrylate, ethylene glycol dimethacrylate, pentaaerythritol tri- and tetraacrylate and methacrylate; acryloxy- and methacryloxy-alkyl ethers of bisphenol A, such as di-(3-acryloxy-2-hydroxypropyl) ether of bisphenol A and di-(3-acryloxy-2-hydroxypropyl) ether of tetrabromo-bisphenol A; unsaturated amides, such as 1,6-hexamethylene bisacrylamide; vinyl esters, such as divinyl succinate, divinyl phthalate, and divinyl benzene-1,3-disulfonate; styrene and derivatives thereof; and N-vinyl compounds, such as N-vinyl carbazole.

The binder is a film forming material which may contain reactive groups. Suitable binders that can be used alone or in combination are well known in the art. These include polyacrylate and alpha-alkyl acrylate esters; polyvinyl esters; ethylene vinyl acetate copolymers; polystyrene polymers and copolymers; vinylidene chloride copolymers; polyvinyl chloride and copolymers; synthetic rubbers; high molecular weight polyethylene oxides of polyglycols; epoxides; copolyesters; polyamides; polycarbonates; polyvinyl acetals; polyformaldehydes. Recently there has been more and more interest in binders which are aqueous processable. For aqueous processability, the binders should be developable by aqueous alkaline solution. By "developable" is meant that the binders are soluble, swellable or dispersible in the developer solution. Preferably, the binder is soluble in the developer solution. Particularly preferred as binders are acidic, polymeric, organic compounds. Single or multiple binder compounds can be used. One class of binders which is useful in the process of the invention is vinyl addition polymers containing free carboxylic acid groups. These are prepared from 30–94 mole percent of one or more alkyl acrylates and 70–6 mole percent of one or more alpha-beta ethylenically unsaturated carboxylic acids; more preferably from 61–94 mole percent of two alkyl acrylates and 39–6 mole percent of an alpha-beta ethylenically unsaturated carboxylic acid. Suitable alkyl acrylates for use in preparing these polymeric binders include methyl acrylate, ethyl acrylate, propyl acrylate, butyl acrylate, and the methacrylate analogs. Suitable alpha-beta ethylenically unsaturated carboxylic acids include acrylic acid, methacrylic acid, crotonic acid, maleic acid or maleic anhydride, and the like. Binders of this type, including their preparation, are described in German Application OS 2,320,849, published Nov. 8, 1973. Styrene can be substituted for one of the alkyl acrylate or methacrylate components. Also suitable are copolymers of styrene and substituted styrenes with an unsaturated carboxyl-containing monomer, as described in detail in British Patent 1,361,298.

Other components conventionally added to photohardenable compositions can be present to modify the physical properties of the layer. Such components include: plasticizers, thermal stabilizers, optical brighteners, ultraviolet radiation absorbing material, color formers, adhesion modifiers, coating aids, and release agents. In addition, depending on the application, other inert additives can be employed such as dyes, pigments and fillers. These additives are generally present in minor amounts so as not to interfere with the exposure of the compositions.

Typical compositions for the photohardenable layer are, by weight, based on the total weight of the photohardenable layer: photoinitiator system, 0.1 to 10%, preferably 1 to 7%; ethylenically unsaturated compound(s), 5 to 60%, preferably 15 to 50%; binder(s), 25 to 90%, preferably 45 to 75%; all other components, 0 to 5%, preferably 0 to 4%. The thickness of the layer varies according to the end use. Generally, the thickness is in the range of 0.7 to 125 microns.

It is possible to have more than one photosensitive layer in the photosensitive film. The layers can have the same or different compositions. It is also possible to have non-photosensitive layers, to adjust adhesion or other properties. The overall thickness of all the layers, excluding the support and coversheet, should be in the same range as that listed above for the single photosensitive layer, although greater thicknesses can be used.

Figure 1B:
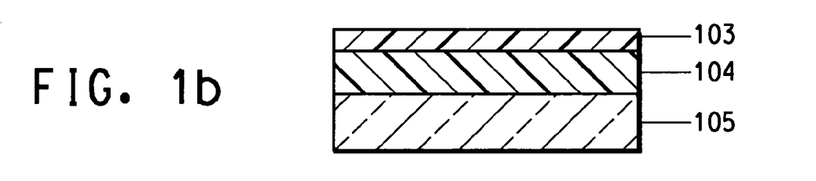

FIG. 1(b) illustrates an assembly wherein a removable base layer was removed from a photohardenable layer (104) that has a tacky surface and an optional cover layer (103) such as MYLAR® film, followed by laminating the photohardenable layer onto a substrate (105). Substrates that may be used in the assembly could be rigid or flexible, and permanent or temporary, and are known by those skilled in the art of circuit assembly. Some examples of substrates include: glass panels (for example, a soda lime glass), glass-ceramic, low-temperature co-fired ceramics, alumina, aluminum oxide, and coated substrates, such as porcelainized steel, glazed ceramic substrates, and insulated metal substrates which are insulated with ceramic, glass or polymer. The substrates could be in their fired or green state. The photohardenable layer is sandwiched between the substrate and the cover layer. The cover layer is transparent for actinic radiation penetration and protects the tacky surface of the photohardenable layer.

Figure 1C:
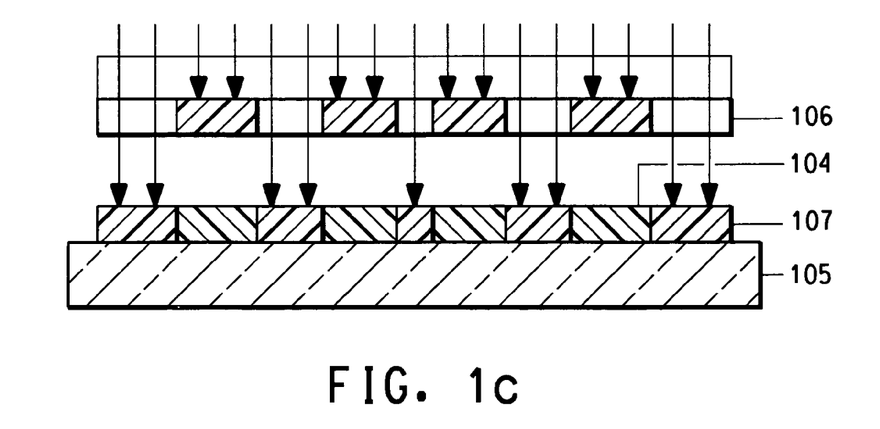
Figure 1D:
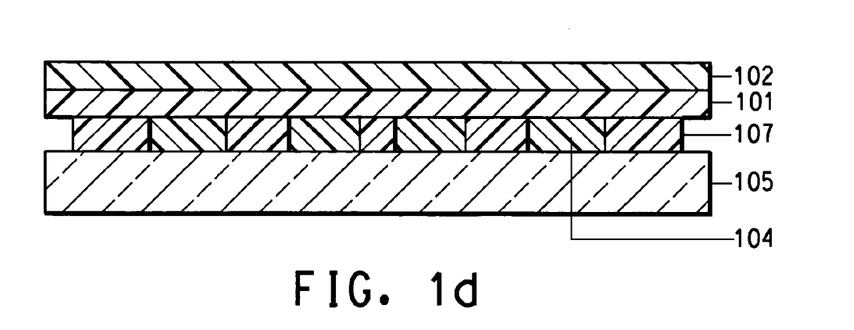
Figure 1E:
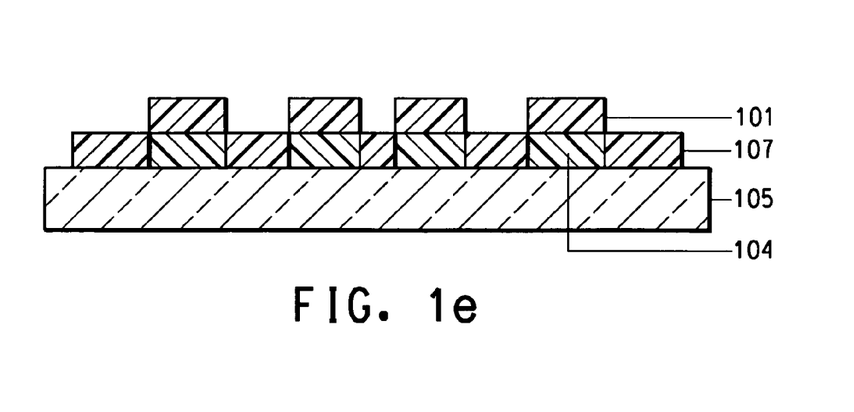
Figure 2A:
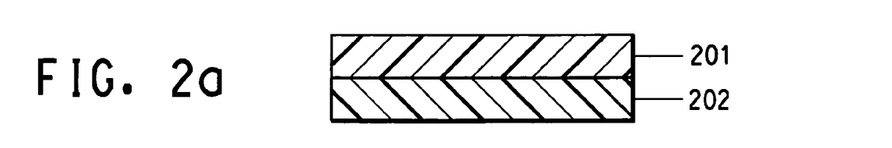
FIG. 2 is an illustrative diagram depicting an embodiment of the process of the present invention.
Figure 2B:
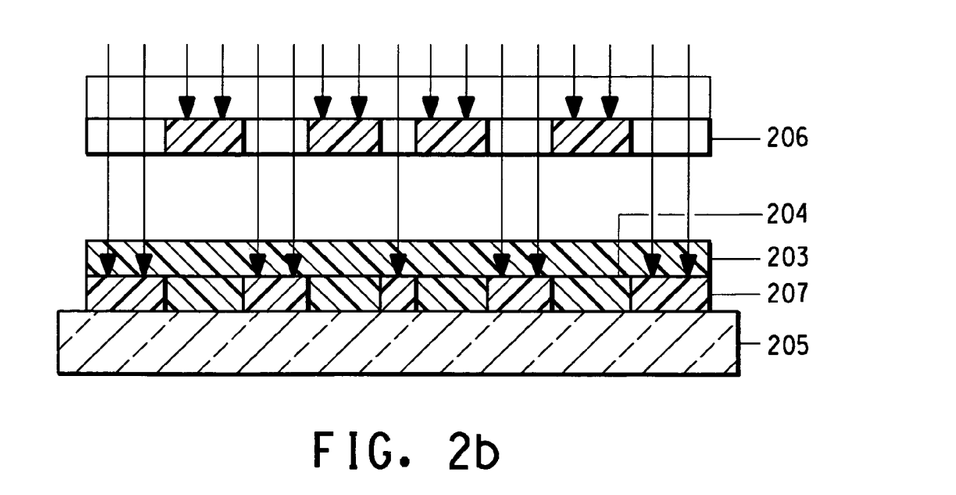
Figure 2C:
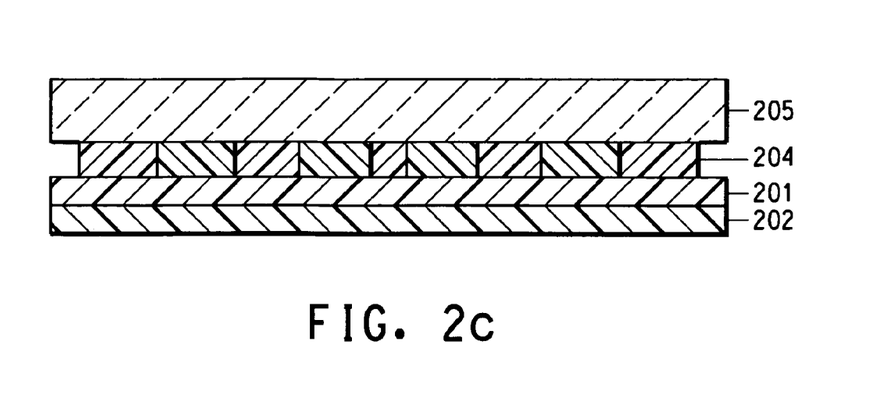
Figure 2D:
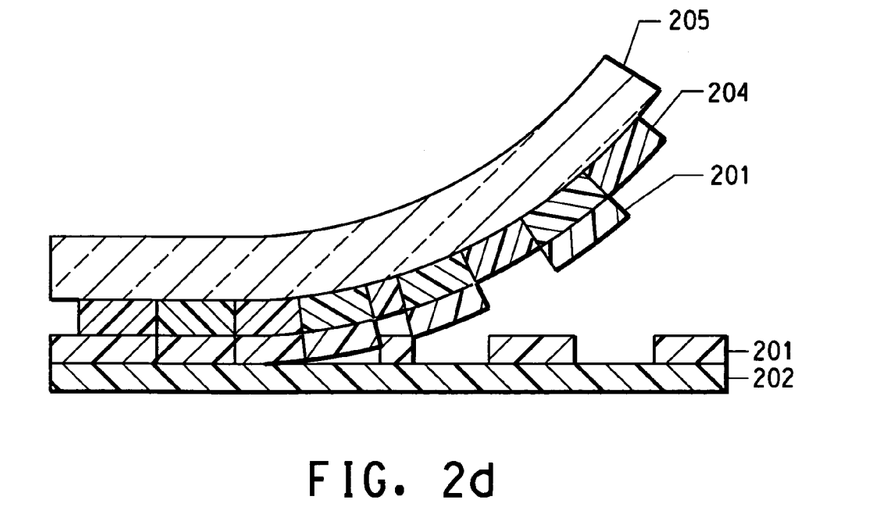

As illustrated by FIG. 1(c), image-wise exposing the photohardenable layer with actinic radiation through a patterned photomask (106) causes detackification of the exposed areas of the photohardenable layer (107) forming a pattern, for example a circuit pattern which would have electrically functional properties. The circuit pattern is a positive image wherein it would be the same as that found on the photomask. After exposure, if present, the cover sheet on the photohardenable layer is removed. FIG. 1(d) illustrates the transfer sheet (thick film material side facing the imaged photohardenable layer) laminated onto the photohardenable layer (104) and (107). The thick film composition (101) will substantially adhere to the unexposed tacky areas of the photohardenable layer. After peeling the used transfer sheet, which has a reverse circuit pattern formed thereon, off of the photohardenable layer, a thick film circuit pattern is produced forming an article as illustrated in FIG. 1(e). The above process may be repeated, i.e., photohardenable layer, imaging, applying transfer sheet, at least once until desired layer number is reached. The article will then undergo a firing step.

Optionally, depending on the application of the assembly, the assembly may undergo a heat treatment which causes the thick film circuit pattern to diffuse through the tacky non-hardened photohardenable layer onto the substrate surface. This is then followed by a firing step.

The presently available materials that make up the photohardenable layer will be fired or burned-out at about 400° C. Thus, if complete burnout and removal of the photohardenable layer is desired, then the recommended firing temperature should be above 400° C.

In order to achieve adhesion of the thick film composition when firing in the 400 to 1000° C. temperature range, it was mentioned that a glass frit/inorganic binder system in the thick film composition is important. In some special cases, this requirement might not be necessary. When an inorganic binderless thick film composition is applied to a substrate that contains dielectric or glassy components with a softening point close to the firing/sintering temperature of the binderless thick film composition, then the substrate surface itself can replace the role of the glass/inorganic powders in the traditional thick film composition. Additionally, if the conductive, resistive or dielectric powder itself is coated with some kind of glass or ceramic (or mixture thereof), this coating could act as the inorganic binder system of the thick film composition. The glass/ceramic coating can be applied in a number of ways including spraying, solution dipping, aerosol reduction, precipitation, vapor deposition, tumbling and so on. The coated particles could be heat treated for a uniform and robust coating.

In another embodiment, it is possible to skip the exposure or imaging step of the photohardable layer disposed on a substrate as described above. In absence of an imaging step, once the cover sheet of the photohardenable layer is removed the entire surface of the photohardenable layer will remain tacky. Upon lamination of a transfer sheet to the tacky photohardenable layer and removal of the sheet, the thick film composition of the transfer sheet will substantially remain on the photohardenable layer. Therefore, the pattern created will be full coverage of the unexposed area. This is especially useful in dielectric thick film composition applications.

FIG. 2, describes a polymer thick film composition patterning method using a negative image process. FIG. 2(a) depicts the polymer thick film composition (201) applied and dried on a suitable support (202) creating a transfer sheet. The support could be rigid or flexible, organic or inorganic based. This embodiment is particularly useful for a heat sensitive support, such as a printed wiring board. Although, supports that may withstand firing conditions can be used. The polymer thick film composition is applied on the support by any suitable means, including printing, casting, and spraying and then dried. In FIG. 2(b) a photohardenable layer (which comes sandwiched between a base layer (205) and an optional cover sheet (204)), such as CROMALIN®, is image-wise exposed through the cover sheet with a negative image of a desired pattern. The cover sheet (203) is then removed. FIG. 2(c) depicts the lamination of the imaged photohardenable layer (204) onto the polymer thick film composition transfer sheet where the thick film composition adheres to the support in the non tacky areas of the imaged layer (207) and substantially adheres to the imaged layer in the tacky areas. In FIG. 2(d) the imaged photohardenable layer and its base layer are then peeled off, leaving behind a patterned polymer thick film composition (201) on the support (202) forming a patterned article. The patterned polymer thick film composition is a negative image of the exposed photo-tool (206) pattern. The patterned polymer thick film composition is then cured at the desired time, temperature, atmosphere and pressure to achieve the properties needed for the electronic application. Polymer thick film compositions useful in this application are well known and described hereinabove.

The new processes described herein offer many advantages, including capabilities for large area substrates, precision and high density patterning, uniform metallization thickness across the whole substrate surface, automated mass production capabilities, applicable to various shape, type, flexible and rigid substrates (for example: polyester, polyolefin, polycarbonate, PVC, MYLAR®), TRESPAPHAN®, polystyrene, printed wiring board, laminates, BT, polyimide, paper, metal or other sheets, glass, ceramics-oxide and nonoxide, green-unfired ceramics and glass ceramics), sequential or single firing/cofiring/curing multi-layer patterning and so on.

Figure 3:
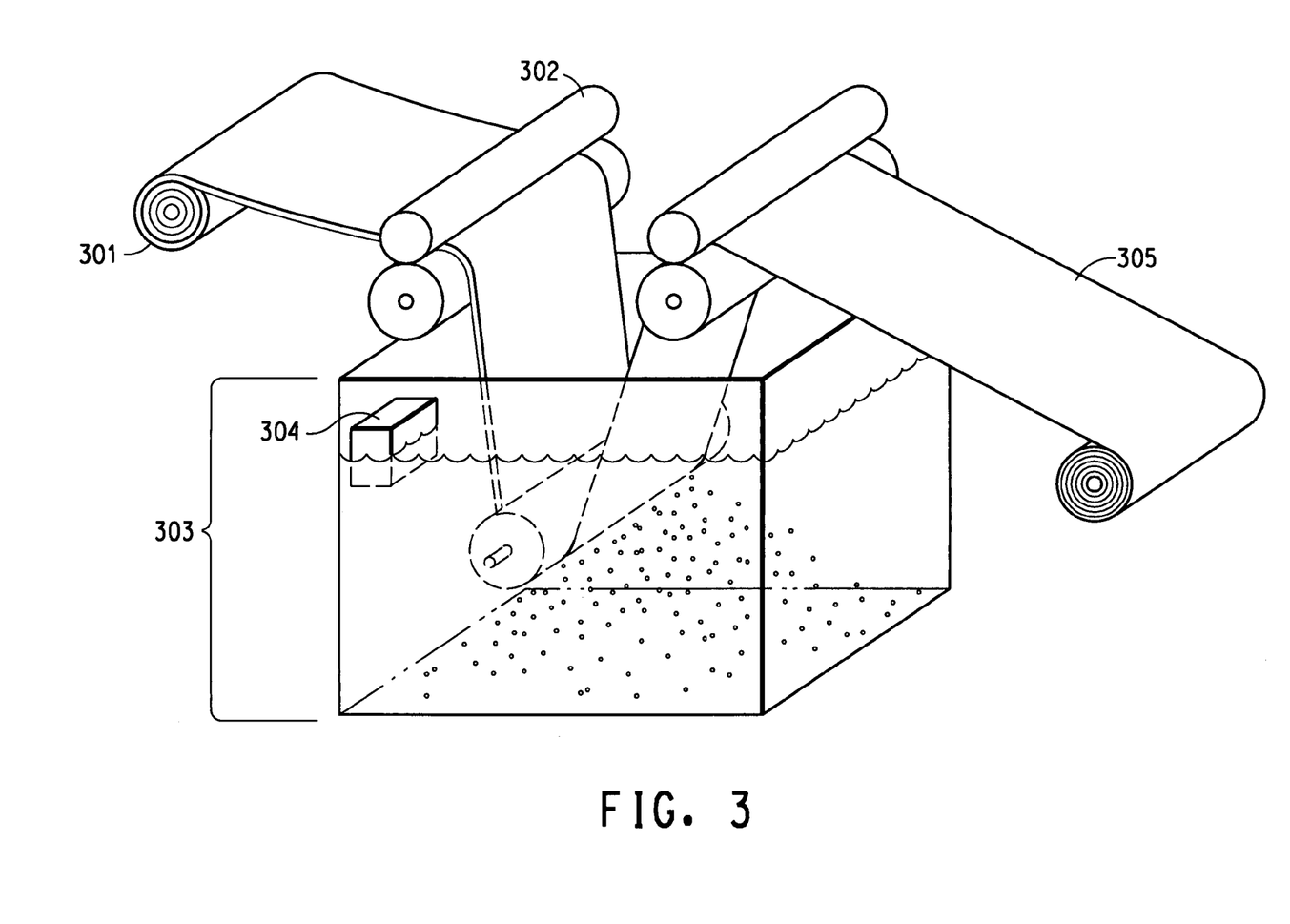
FIG. 3 is an illustrative diagram depicting an embodiment of the recovery process of the present invention.

The invention, also, extends to a recovery process wherein a used transfer sheet that has undergone transfer processing resulting in a reverse image of the desired circuit pattern is stripped of any remaining thick film composition wherein the stripped thick film composition could then be reclaimed. FIG. 3 illustrates an embodiment of a recovery system that is a roll to roll system wherein the transfer sheet is a continuous roll. A used transfer roll (301) is threaded through a double roller system (302) which allows for controlled delivery of the transfer roll into a vat (303) which contains a solvent bath that will dissolve the organics found in the thick film composition wherein the thick film composition and the solvent form a solution. For ease of processing in a manufacturing facility, it is desirable to use the same solvents that were used in making the thick film composition found on the transfer roll, but any compatible solvent that will dissolve the thick film composition may be used. An optional agitating source (304) may be used in the solvent vat. The agitating source may be an ultrasonic, agitator, scrubber or any other device that would agitate the particles of the thick film composition for removable from the support. The uncoated support is then removed from the vat that contains particles from the thick film composition solubilized by the solvent. The solution is drained from the vat and the rheology of the solution is adjusted which renders the solution suitable for casting on a support for the formation of new transfer sheets or transfer rolls.

EXAMPLES

Formation of Transfer Sheet

Process for casting a thick film silver containing composition on TRESPAPHAN® support is described. The transfer sheet produced is used in Examples 1–4 and 8 hereinbelow unless otherwise specified in the example. All percentages are in weight percent unless otherwise stated.

In a stoneware ceramic jar, the following ingredients were added:
Alumina Beads, filling the jar about 40 percent
58.5 wt. % Organic Medium Composition
37.5 wt. % Silver Powder (spherical silver, 0.1 to 3 micrometers)
1.0 wt. % Frit Composition
3.0 wt. % Ethyl acetate

| Organic Medium composition: | |
| --- | --- |
| Ethyl Acetate | 82% |
| Methyl Ethyl Ketone | 6% |
| Diethylene Glycol Dibutyl Ether | 2% |
| Dibutyl Phthalate | 0.5% |
| Ethyl Cellulose | 2% |
| VARCUM ® Resin* | 7.5% |
| Frit Composition | |
| Silicon Dioxide | 8% |
| Aluminum Oxide | 0.5% |
| Lead Oxide | 70% |
| Boron Oxide | 12.5% |
| Zinc Oxide | 6.5% |
| Lead Fluoride | 2.5% |

The mixture is jar milled for 12 to 15 hours, the beads screened and the composition is cast on a TRESPAPHAN® sheet made by Hoechst TRESPAPHAN® of Winston-Salem, N.C., using a doctor blade with an opening of 15 micrometers.

The cast sheet is air dried for 15 minutes followed by oven drying at 80° C. for 10 minutes. The silver-coated transfer sheet is ready for use.

VARCUM® Resin available from Schenectady International, Schenectady, N.Y.

Example 1

A positive CROMALIN® film, type ICFD (made by E. I. du Pont de Nemours and Company, Wilmington, Del.), having a coating weight in the range of 300 mg/dm$^2$, was laminated (after peeling the removable base layer) to a soda lime glass substrate at about 250 d/F. The CROMALIN® film was exposed using a photomask circuit pattern (5KW UV bulb) for 15 units. The cover sheet on the imaged CROMALIN® film was peeled off. A transfer sheet was laminated onto the imaged film (with the thick film side of the transfer sheet facing the imaged layer). Peeling the transfer sheet produced the desired pattern where the unexposed areas of the imaged film layer remained tacky and the thick film was disposed on the tacky areas. The structure was fired at 500° C. in air using a standard thick film firing profile for displays. The imaged film was completely burned out and the sintered, patterned thick film adhered strongly to the soda lime glass substrate. There was no detectable adhesion difference between the above patterning approach and comparably with the standard approach where the same silver thick film composition is screen-printed and fired on the same type of glass substrate.

Example 2

The same process as Example 1 was repeated with the exception of no exposure of a CROMALIN® film and processed at a firing temperature of 585° C. The CROMALIN® film (completely covered by the thick film composition of the transfer sheet) was burned out and adhesion of the thick film composition across the substrate surface was obtained.

Example 3

The same process as Example 2 was repeated 6 times (imaged film/thick film composition/imaged film/thick film composition, etc.) and the six-layer imaged film/thick film composition was cofired at 585° C. Similarly, all six layers of the imaged film were burned out and a thick film layer adhered to the glass substrate.

Example 4

A double transfer sheet structure was produced. A first transfer sheet as described in the transfer sheet section above was made, followed by casting and drying a black contrasting resistor composition, product DC243 sold by E. I. du Pont de Nemours and Company onto the thick film side of the first transfer sheet. The double layer transfer sheet was processed according to Example 1 and fired in air at 585° C.

Example 5

A gold based thick film composition product QG150 sold by E. I. du Pont de Nemours and Company was thinned with 10% TEXANOL® sold by Eastman Chemicals, Kingsport, Tenn. and cast on MYLAR® film to make a transfer sheet. The transfer sheet was processed according to Example 1 on a 99.5 percent polished alumina substrate. The structure was fired in air at 850° C. The measured adhesion was good.

Example 6

A gold based thick film composition QG150 thinned as in Example 5 and cast and dried onto TRESPAPHAN® film and processed according to Example 1 on a 96 percent alumina substrate. The resulting structure was fired in air at 850° C. The measured adhesion was similar to a standard process wherein a thick film composition (QG150) is printed and fired on the same type of substrate. Two circular patterns 1875 microns apart were noted. The distance between the two circular patterns were measured in the green state and after firing. The distance between the centers of the fired structure was only 3 microns different when compared to the green unfired structure.

Example 7

Thick film dielectric composition 5704 available from E. I. du Pont de Nemours and Company was cast and dried onto a MYLAR® polyester film support. A positive CROMALIN® sheet was then laminated onto an alumina substrate. The CROMALIN® sheet was exposed to actinic radiation using a photomask to create an imaged layer. The cover sheet on the CROMALIN® sheet was then peeled off exposing the imaged layer. The cast transfer sheet was laminated onto the imaged layer. Peeling the transfer sheet produced the desired pattern on the imaged layer forming a structure. The desired pattern included separated lands and holes for possible via applications. The structure was then fired at 850° C. in air.

Example 8

In order to facilitate recovery and re-use of expensive precious metal or phosphor powders, a thick film composition formulation as found in the transfer sheet section hereinabove was divided and cast onto two separate TRESPAPHAN® sheets wherein a double-step application was used. Inorganic powders absent precious metals was dispersed in an organic medium and cast onto a first TRESPAPHAN® carrier sheet. Then the silver precious metal powders were dispersed in organic medium and cast onto a second TRESPAPHAN® carrier sheet. Patterning was accomplished in two steps. First, the inorganic coated TRESPAPHAN® sheet was laminated on top of an imaged CROMALIN® sheet similar to the process described in Example 1. Second, the process was repeated using the silver metal coated TRESPAPHAN® sheet laminated to a second imaged CROMALIN® sheet exposed with the same pattern as the first. The structure was then fired in air at 500° C. The resistivity of the fired silver pattern was found to be similar when using either a single step transfer sheet application (for example, as found in Example 1) or double step transfer sheet application as given in this example.

Example 9

A multilayer capacitor build was accomplished by first casting a wet stack of X7R type Barium Titanate based dielectric made by Ferro Corporation, Riverside, Calif., onto a first MYLAR® polyester film forming a dielectric sheet. A palladium/silver (27/73) conductor available from E. I. du Pont de Nemours and Company was cast onto a second MYLAR® film forming a transfer sheet. A three conductor layer capacitor structure was built by first laminating two layers of the dielectric MYLAR® sheet, followed by lamination of a CROMALIN® sheet which was then imaged through a photomask; cover sheet was removed; then the palladium-silver conductor transfer sheet was laminated onto the imaged layer and peeled off leaving a patterned electrode layer. The dielectric sheet is then laminated on top of the patterned layer. (The need for a tacky photohardenable layer (CROMALIN® sheet) between the patterned electrode and the dielectric was not required; but may be added based on the green strength characteristics of the dielectric layer.) The process of CROMALIN® sheet/image/peel cover/laminate electrode transfer sheet/peel was repeated three times to obtain a three layer capacitor structure. The top layer is then topped by lamination with two layers of dielectric. The whole structure is then removed from the MYLAR® base, fired in an oven at 1200° C., and cut into pieces. The above represents an alternate method of building multilayer (tens or hundreds of layers) capacitor structures using the desired building base, suitable dielectric compositions and electrode conductor compositions.

Example 10

A polymer thick film silver conductor composition (Product 5000 available from E. I. du Pont de Nemours and Company) thinned with Thinner 8260 (available from E. 1. du Pont de Nemours and Company) was screen printed onto a MYLAR® polyester film, such that the film is covered with the conductor composition forming a transfer sheet. The printed thickness of the composition on the film was about 5 microns. The composition was dried at 50° C. for 10 minutes to drive off volatile solvents. Separately, a CROMALIN® photohardenable layer (which comes sandwiched between a support layer and a cover sheet) was imaged with a negative patterned image of a circuit pattern creating tacky and non-tacky areas. The cover sheet is then removed and the imaged layer on the support layer was laminated onto the composition side of the transfer sheet. The imaged layer and its support layer and composition that stuck to the tacky areas of the imaged layer were peeled off, leaving behind a patterned polymer thick film composition on the support. The patterned polymer thick film was a negative image of the photo-tool pattern. The patterned polymer thick film composition is then cured at 120° C. for 10 minutes to obtain the required adhesion and resistivity properties of the polymer thick film composition.

What is claimed is:

1. A process for the recovery of a thick film composition from a support comprising a support having a dried thick film composition in the form of a reverse circuit pattern comprising the sequential steps of:
   (a) passing the dried thick film composition on a first support through a solvent bath to form a solution of the thick film composition;
   (b) adjusting the viscosity of the solution to form a castable solution; and
   (c) applying the castable solution on a second support.

2. The process of claim 1 further comprising a step wherein the solution is periodically removed.

3. The process of claim 1 further comprising drying the solution on the second support wherein the solvent is volatilized and the dried solution and the support form a sheet.

4. The process of claim 3 wherein the sheet is utilized in a process for forming a pattern having electrically functional properties on a substrate comprising the steps of:
   (a) providing a photosensitive layer having a tacky surface disposed on a substrate;
   (b) providing a transfer sheet comprising a removable support and at least one layer of a thick film composition disposed on the support;
   (c) image-wise exposing the photosensitive tacky surface to form an imaged layer having unexposed tacky and exposed non-tacky areas;
   (d) applying the thick film composition of the transfer sheet to the imaged layer;
   (e) separating the transfer sheet from the substrate wherein the thick film substantially adheres to the support in the exposed non-tacky areas and substantially adheres to the unexposed tacky areas to form a patterned thick film composition; and
   (f) subjecting the patterned thick film composition to heat thereby forming a patterned article.

* * * * *